United States Patent
Ogino et al.

(10) Patent No.: US 6,456,830 B2
(45) Date of Patent: Sep. 24, 2002

(54) DIVERSITY WIRELESS COMMUNICATION METHOD AND ITS WIRELESS COMMUNICATION APPARATUS

(75) Inventors: Atsushi Ogino, Kokubunji; Hideya Suzuki, Ichikawa; Tomoaki Ishifuji, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/930,977

(22) Filed: Aug. 17, 2001

Related U.S. Application Data

(60) Continuation of application No. 09/739,396, filed on Dec. 19, 2000, which is a division of application No. 09/513,928, filed on Feb. 28, 2000, now Pat. No. 6,249,669.

(30) Foreign Application Priority Data

Mar. 2, 1999 (JP) .......................................... 11-053612

(51) Int. Cl.$^7$ ............................................... H04B 1/06
(52) U.S. Cl. ..................... 455/134; 455/63; 455/137; 455/277.2; 375/347
(58) Field of Search ...................... 455/134, 63, 277.2, 455/133–137, 277.1, 140, 278.1, 276.1, 297, 345, 347, 272–275, 65, 606; 348/706, 876; 375/347, 349, 330–332, 264–267, 283; 370/465–468, 250–251; 714/746, 756, 795, 752, 785

(56) References Cited

U.S. PATENT DOCUMENTS

| | | | |
|---|---|---|---|
| 5,157,672 A | | 10/1992 | Kondou et al. ............. 714/795 |
| 5,335,010 A | | 8/1994 | Lindemeier et al. ......... 348/706 |
| 5,383,219 A | | 1/1995 | Wheatley, III et al. ...... 370/342 |
| 5,390,342 A | * | 2/1995 | Takayama et al. .......... 455/134 |
| 5,396,645 A | * | 3/1995 | Huff .......................... 455/134 |
| 5,453,997 A | | 9/1995 | Roney, IV ................... 371/41 |
| 5,557,603 A | * | 9/1996 | Barlett et al. ............... 370/228 |
| 5,559,838 A | * | 9/1996 | Nakagoshi ................... 370/347 |
| 5,671,221 A | * | 9/1997 | Yang .......................... 370/320 |
| 5,687,197 A | * | 11/1997 | Powell et al. ............... 375/347 |
| 5,692,018 A | * | 11/1997 | Okamoto ..................... 375/233 |
| 5,710,995 A | * | 1/1998 | Akaiwa et al. .............. 375/347 |
| 5,737,365 A | * | 4/1998 | Gilbert et al. .............. 375/224 |
| 5,742,896 A | * | 4/1998 | Bose et al. ................. 455/133 |
| 5,757,767 A | * | 5/1998 | Zehavi ....................... 370/208 |
| 5,761,252 A | * | 6/1998 | Iinuma ....................... 375/347 |
| 5,805,643 A | * | 9/1998 | Seki et al. .................. 375/327 |
| 5,859,870 A | * | 1/1999 | Tsujimoto ................... 370/441 |
| 5,893,035 A | * | 4/1999 | Chen .......................... 455/442 |
| 5,901,187 A | * | 5/1999 | Iinuma ....................... 375/347 |
| 6,029,056 A | * | 2/2000 | Kiyanagi et al. ........... 455/137 |
| 6,151,372 A | * | 11/2000 | Yamamoto ................... 375/267 |
| 6,215,777 B1 | * | 4/2001 | Chen et al. ................. 370/335 |

FOREIGN PATENT DOCUMENTS

JP      5-83181      4/1993

OTHER PUBLICATIONS

IEEE Transactions on Information Theory, vol. 41, No. 6, Nov. 1995, "On the Decoding of Algebraic Geometry Codes," T. Hoholdt et al, pp. 1589–1614.

Japan Institute of Electronics, Information and Communication Engineers, 1990, "Coding Theory," H. Imai, pp. 182–188.

* cited by examiner

*Primary Examiner*—Thanh Cong Le
*Assistant Examiner*—Pablo N. Tran
(74) *Attorney, Agent, or Firm*—Mattingly, Stanger & Malur, P.C.

(57) ABSTRACT

In the conventional diversity reception, information included in each non-selected signal does not contribute to an improvement in the reliability of communications, and transmitting power has been dissipated to satisfy required communication quality. Owing to the setting of encoding in respective base stations to injection, signals each including the same contents, which are received by a mobile station, are used for increasing the reliability of communications without depending on the number of the signals which were capable of being received by the mobile station, to thereby reduce transmitting power for satisfying required communication quality.

4 Claims, 3 Drawing Sheets

DIVERSITY WIRELESS COMMUNICATION METHOD AND ITS WIRELESS COMMUNICATION APPARATUS

This application is a continuation of application Ser. No. 09/739,396, filed Dec. 19, 2000, which is a division of application Ser. No. 09/513,928, filed Feb. 28, 2000, now U.S. Pat. No. 6,249,669.

BACKGROUND OF THE INVENTION

The present invention relates to a mobile wireless communication system. The present invention also relates particularly to a diversity wireless transmitting/receiving system for transmitting data each including the same contents from a plurality of transmitting stations and performing diversity reception of the data by a receiving station.

In a mobile communication in which communications are conducted between base stations and a mobile station, a system has been adopted in which the mobile station performs diversity reception of signals each including the same contents from a plurality of the neighboring base stations. As one example of this type of diversity reception system, Japanese Patent Laid-open (Kokai) No. Hei 5-83181 discloses a system wherein an error check is made to each of a plurality of received signals identical in contents and one signal determined to be free of an error is selected.

SUMMARY OF THE INVENTION

In the aforementioned conventional system, information included in each signal non-selected as a result of the error check does not contribute to an improvement in the reliability of communications. As a result, transmitting power has been dissipated to satisfy required communication quality.

In the present invention, such a configuration that information included in all the signals to be selected can be effectively utilized, is adopted to reduce transmitting power for satisfying required communication quality. Described specifically, respective base stations respectively transmit those obtained by dividing a code word in an error correcting code, and a mobile station combines fragments of the divided code words and decodes the combined one, thereby bringing information to a high degree of reliability. The following problems arise at this time.

Upon firstly establishing the mobile communication, the existing locations of a mobile station are roughly divided into the two as follows:

(1) when the mobile station exists in a location where it can receive signals with suitable intensity from a plurality of base stations due to reasons such as the passage of the mobile station through a point located midway between the plurality of base stations.

(2) when the mobile station exists in a location where it is able to receive a signal with sufficient intensity from a given base station but unable to receive signals with suitable intensity from other base stations due to the reason that it is far distant therefrom, for example.

Thus, the mobile station is not always able to receive signals identical in contents from a plurality of base stations corresponding to the ever-stable number of base stations. Namely, the fragments of the code words are not always complete or available. Therefore, the mobile station has to be able to decode desired information even from one received signal from one arbitrary base station, i.e., one arbitrary fragment of each code word.

The present invention has been completed to solve the foregoing problems. Owing to the setting of encoding in respective base stations to injection, signals each including the same contents, which are received by a mobile station, are used for increasing the reliability of communications without depending on the number of the signals which were capable of being received by the mobile station, thereby reducing transmitting power for satisfying required communication quality. Further, a wireless apparatus according to the present invention comprises a plurality of wireless transmitting stations each provided with a transmitting antenna, a transmitter capable of transmission through a pre-specified radio channel, an encoder for performing encoding processing corresponding to the radio channel, and a data input interface for obtaining data to be transmitted from an external device; and a wireless receiving station including a receiving antenna, a receiver capable of independently receiving signals from a plurality of radio channels, a plurality of buffers for respectively storing received data therein according to the received radio channels, a selector A for reading the data from the plurality of buffers and sending the data to either one of a plurality of decoders and a data combiner according to the read buffers, the data combiner for combining data in predetermined order, a plurality of decoders for respectively executing predetermined decoding processes, a selector B for selecting decoded data in interlock with the selector A and outputting the same therefrom, and a data output interface for supplying the received and decoded data to an external device.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

The present invention will be described with reference to the accompanying drawings in which.

DETAILED DESCRIPTION OF THE PREFERRED EMBODIMENTS

Figure 1:
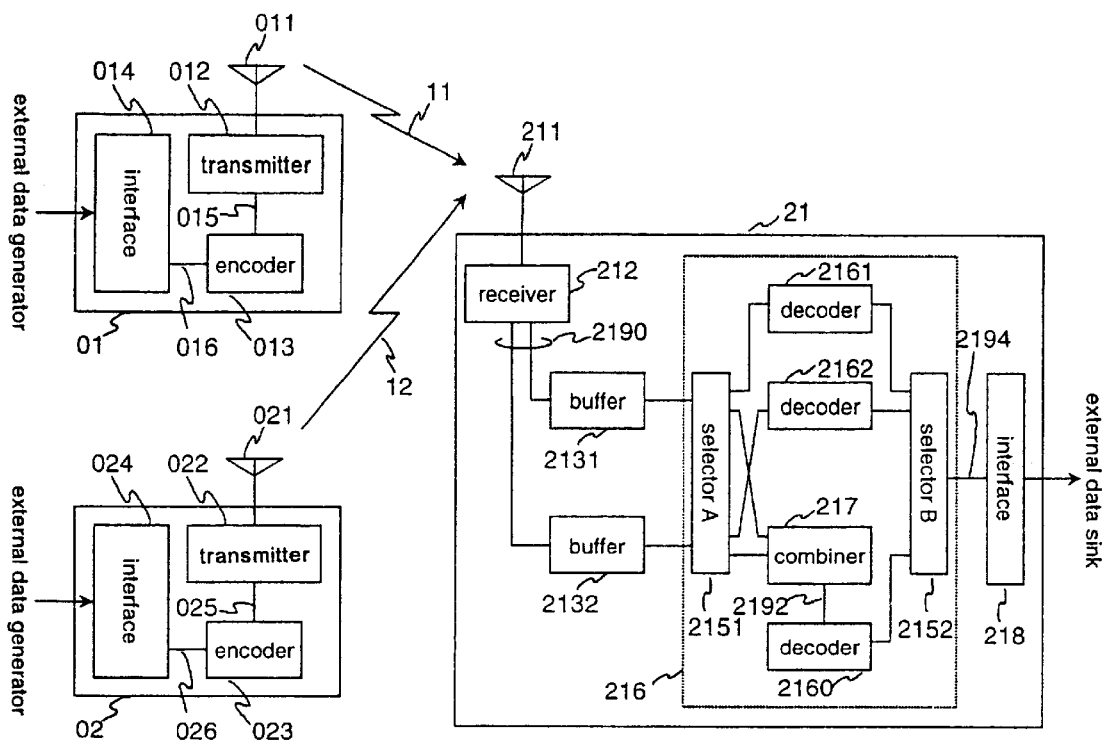
FIG. 1 is a diagram for describing one example of a diversity radio communication apparatus according to the present invention.

An embodiment to which the present invention is applied, will be explained with reference to FIG. 1. In the same drawing, reference numerals 01 and 02 indicate a wireless transmitting station respectively, and reference numeral 21 indicates a wireless receiving station. The wireless transmitting stations 01 and 02 and the wireless receiving station 21 correspond to base stations and a mobile station used in mobile communications respectively. In the wireless transmitting station 01, a data input interface 014 controls the input of data between an external data generator and an encoder 013. The encoder 013 performs encoding on input data 016 to output a code word 015. An encoding method of the encoder 013 is determined according to a radio channel 11 used by a transmitter 012. The details of the encoding method will be described later. The transmitter 012 performs conversion to a radio signal format, modulation, frequency conversion, filter processing and amplification on the code word 015 and thereafter transmits the processed code word through an antenna 011.

A transmitting process of the wireless transmitting station 02 is substantially similar to the wireless transmitting station 01. An encoding method of an encoder 023 is determined according to a radio channel 12 used by a transmitter 022. Both transmitting stations are different from each other in the radio channels 11 and 12 used by their transmitters 012 and 022 and the encoding methods of their encoders 013 and 023. Incidentally, the radio channels 11 and 12 are not limited to those specified by frequencies and include even those specified by time slots or spread spectrum codes.

In the wireless receiving station 21, reference numeral 212 indicates a receiver and independently receives signals for the radio channels 11 and 12 through an antenna 211. The receiver 212 performs amplification, frequency conversion, filter processing, demodulation and conversion from a radio signal format to received data 2190 on the received signals on the radio channels 11 and 12. If the received radio channel is found to be 11, then the receiver 212 temporarily stores the received data 2190 in a buffer 2131. If the received radio channel is found to be 12, then the receiver 212 temporarily stores the received data 2190 in a buffer 2132. Next, the data temporarily stored in the buffers 2131 and 2132 are read and decoded by a decoding unit 216. How to decode the data here is determined according to receiving conditions at the radio channels 11 and 12 and the encoding methods of the wireless stations 01 and 02. The details of a decoding method will be described later. A data output interface 218 performs control for outputting output data 2194 decoded by the decoding unit 216 to an external data sink.

The operation of the decoding unit 216 will be explained in detail. Since radio propagation environments in mobile communications change minute by minute, the receiving station is not always able to receive desired data from both the radio channels 11 and 12. When the data sent from the wireless transmitting stations 01 and 02 are received only from either one of the radio channels, the received data is stored only in either the buffers 2131 or 2132 according to the radio channel having received the corresponding data therethrough. A selector A 2151 checks for the presence or absence of the received data in the buffers 2131 and 2132. If it is found that the data has been stored in the buffer 2131 alone, then the selector A 2151 reads it and inputs the received data to a decoder 2161. On the other hand, when it is found that the data has been stored in the buffer 2132 alone, the selector A 2151 reads it and inputs the received data to a decoder 2162.

The decoders 2161 and 2162 are decoders corresponding to the encoding methods of the encoders 013 and 023. Determination as to which decoding method in the decoders should be applied, is made according to the encoding methods of the encoders 013 and 023 in the wireless transmitting stations 01 and 02. When the data from the wireless transmitting stations 01 and 02 are received from both radio channels, the received data are respectively stored in both of the buffers 2131 and 2132 corresponding to the radio channels having received the corresponding data. The selector A 2151 checks for the presence or absence of the received data lying within the buffers 2131 and 2132 and detects the storage of the data in both the buffers 2131 and 2132. Further, the selector A 2151 reads the received data from the two buffers and inputs the same to a data combiner 217. The data combiner 217 integrates and combines the plurality of received data obtained from both the buffers 2131 and 2132, and thereafter a decoder 2160 decodes the combined data. How to integrate, combine and decode the data here is determined depending on the encoding methods of the encoders 013 and 023 in the wireless transmitting stations 01 and 02.

Summaries of the encoding methods of the encoders 013 and 023 in the wireless transmitting stations 01 and 02 and the data combining/decoding methods of the data combiner 217 and decoders 2161, 2162 and 2160 in the wireless receiving station 21 will consecutively be explained.

The encoding methods of the encoders 013 and 023 will first be described. Each of the encoders 013 and 023 performs a process equivalent to the fact that a code word in the same error correcting code is generated from one input data sequence and divided into two, and a fragment of the predetermined one thereof is outputted. The encoder actually generates only a fragment of a code word of the predetermined one from one input data sequence and outputs it therefrom. However, since the wireless receiving station 21 does not always receive both signals transmitted from the wireless transmitting stations 01 and 02, a limitation is imposed on the encoding method so that the data sequence can be decoded even from one fragment alone. Described specifically, mapping from the input data sequence to the fragment of the code word is limited to injection.

The decoding methods employed in the decoders 2161 and 2162 in the wireless receiving station 21 will next be described. The decoders 2161 and 2162 respectively perform decoding processes corresponding to the encoding methods of the encoders 013 and 023. Particularly when maps in the encoders 013 and 023 are respectively isomorphism, the decoding processes of the decoders 2161 and 2162 result in matrix multiplication.

The data combining method of the data combiner 217 will continuously be described. The wireless transmitting stations 01 and 02 respectively generate a code word in an error correcting code from one input data sequence and divide the code word into two. Further, they respectively transmit respective fragments of the divided code words through the radio channels 11 and 12 different from each other therefrom. Therefore, when the fragments of the divided code words are received by the wireless receiving station 21, the wireless receiving station 21 is able to specify either of the fragments thereof according to the received radio channel. When both the fragments of the divided code words are received by the wireless receiving station 21, the data combiner 217 performs an operation opposite to the dividing procedure defined in advance to thereby re-arrange the received ones in a manner similar to the code words before division generated in the wireless transmitting stations 01 and 02.

The decoding method of the decoder 2160 will next be explained. A decoding process corresponding to the method of encoding the code words before division generated in the wireless transmitting stations 01 and 02 is carried out by the decoder 2160.

The details of encoding/decoding will be disclosed herein. An example of an encoding/decoding method constructed based on algebraic-geometric codes is shown as a first embodiment. According to the theory of algebraic-geometric codes introduced by V. D. Goppa (see e.g. Hideki Imai, Coding theory, Japan: IEICE, pp. 182–188, 1990), the following map $\Phi$ provides or gives q-ary (n, m−g) linear codes wherein a code length is n and the number of information symbols is (m−g), assuming that F: a finite field GF (q), X: an algebraic curve, Q: an F-rational point on X, $P_1, P_2, \ldots, P_n$: n distinct, F-rational points on X different from Q, G: a divisor (m−1)Q, where m≦n, D: a divisor $P_1+P_2+ \ldots +P_n$, L(G): the linear space of rational functions on X associated to G. However, g indicates the genus of the algebraic curve X.

$$\Phi: L(G) \ni f \to (f(P_1), f(P_2), \ldots, f(P_n)) \in F^n$$

Since the linear space L(G) is of the same type as a linear space $F^{m-g}$, an arbitrary q value data sequence u having a length (m−g) can be associated with an element f of L(G) in a one-to-one relationship without omission.

In the present invention, m and n, which satisfy l (m−g) ≦n with respect to an integer l greater than or equal to a given 2 in the above-described codes, are selected. Further, n', which satisfies n'≦∥n/l∥ and n'≧(m−g), is selected. However, ∥x∥ is the maximum positive number not exceeding x.

Now consider where l=2 and a sequence of input data 016 and 026 is defined as a q value data sequence u. In this condition, the encoder 013 in the wireless transmitting station 01 effects encoding based on the following map $\Phi_1$ on the same data sequence u to thereby obtain a code word $c^1$.

$$\Phi_1: L(G) \ni f \to (f(P_1), f(P_2), \ldots, f(P_{n'})) = c^1 \in F^{n'}$$

Further, the encoder 023 in the wireless transmitting station 02 effects encoding based on the following map $\Phi_2$ on the same data sequence u to thereby obtain a code word $c^2$.

$$\Phi_2: L(G) \ni f \to (f(P_{n'+1}), f(P_{n'+2}), \ldots, f(P_{n'+n'})) = c^2 \in F^{n'}$$

The above-described maps $\Phi_1$ and $\Phi_2$ respectively provide q-ary (n', m−g) linear codes $C_1$ and $C_2$ in which a code length is n' and the number of information symbols is (m−g). Each of the designed distance about the present codes according to V. D. Goppa, i.e., $d_{C1}=d_{C2}=n'-m+1$.

Decoding of the decoders 2161 and 2162 in the wireless receiving station 21 is carried out by applying the conventional decoding method (see e.g., T. Høholdt & R. Pellikaan, "On the Decoding of Algebraic Geometry Codes", IEEE Transactions on Information Theory, Volume 41, Number 6, pp. 1589–1614) of algebraic-geometric codes with respect to the maps $\Phi_1$ and $\Phi_2$.

The data combiner 217 of the wireless receiving station 21 combines received data sequences $r^1=(r^1_1, r^1_2, \ldots, r^1_{n'})$ to $r^2=(r^2_1, r^2_2, \ldots, r^2_{n'})$ read from the buffers 2131 and 2132 into one and inputs the combined received data sequence $(r^1 r^2)=(r^1_1, r^1_2, \ldots, r^1_{n'}, r^2_1, r^2_2, \ldots, r^2_{n'})$ to the decoder 2160. In practice, the combined received data sequence $(r^1 r^2)$ results in a sequence obtained by addition of some error sequence on a communication channel to a code word of a q-ary (2n', m−g) linear code $C_{12}$ given by map $\Phi_{12}$: $L(G) \ni f \to (f(P_1), f(P_2), \ldots, f(P_{2n'})) \in F^{2n'}$. Since the designed distance $d_{C12}$ about the present code according to V. D. Goppa becomes $d_{C12}=2n'-m+1$, the linear code $C_{12}$ has much stronger error correcting capability as compared with the linear codes $C_1$ and $C_2$. In other words, when the data sent from the wireless transmitting stations 01 and 02 are received from both the radio channels, the data can be decoded as a code word provided with much stronger error correcting capability as compared with when received only from either the transmitting stations. Incidentally, the decoding of the decoder 2160 is performed by applying the conventional decoding method (see e.g., T. Høholdt & R. Pellikaan, "On the Decoding of Algebraic Geometry Codes", IEEE Transactions on Information Theory, Volume 41, Number 6, pp. 1589–1614) of algebraic-geometric codes with respect to the map $\Phi_{12}$.

In the first embodiment, the code rate of the linear codes $C_1$ and $C_2$ may be set to 1 with n'=m−g and g=0. Since the maps $\Phi_1$ and $\Phi_2$ are of isomorphism, the minimum distance for each of the linear codes $C_1$ and $C_2$ becomes 1 and hence no error correcting capability exists. However, the decoding process executed by each of the decoders 2161 and 2162 can be simplified to matrix multiplication of n'×n' over GF(q). On the other hand, the minimum distance of the linear code $C_{12}$ results in n'−1 and can hence be handled as codes equivalent to Reed-Solomon codes given at the code rate ½.

An example of an encoding/decoding method constructed based on convolutional codes will next be explained as a second embodiment. A method of representing convolutional codes is first prepared (see e.g., Hideki Imai, Coding theory, Japan: IEICE, pp. 182–188, 1990). A delimited data sequence is defined as $m_0 m_1 m_2 \ldots$, and an encoded sequence is defined as $w_0 w_1 w_2 \ldots$. However, a data block $m_t$ and a code block $w_t$ (where t=0, 1, 2, ...) are respectively sequences over GF (q) having lengths of k and n, and expressed as follows:

$m_t=(m_{1t}, m_{2t}, \ldots, m_{kt})$, $w_t=(w_{1t}, w_{2t}, \ldots, w_{nt})$

Further, the data sequence and encoded sequence are respectively expressed in the following polynomial representation with D as a delay operator:

$M(D)=m_0+m_1 D+m_2 D^2+ \ldots$ $W(D)=w_0+w_1 D+w_2 D^2+ \ldots$

If $M_i(D)$ and $W_j(D)$ are respectively represented as $M_i(D)=m_{i0}+m_{i1}D+m_{i2}D^2+ \ldots$, (where i=1, 2, ..., k) and $W_j(D)=w_{j0}+w_{j1}D+w_{j2}D^2+ \ldots$, (where j=1, 2, ..., n)

then M(D) and W(D) are expressed as follows:

$M(D)=(M_1(D), M_2(D), \ldots, M_k(D))$ $W(D)=(W_1(D), W_2(D), \ldots, W_n(D))$

Assuming now that G(D) is defined as a transfer function matrix of the convolutional codes, the encoded sequence W(D) can be written as W(D)=M(D)G(D). Here, G(D) is represented as follows:

$$G(D) = \begin{bmatrix} G_{11}(D) & G_{12}(D) & \cdots & G_{1n}(D) \\ G_{21}(D) & G_{22}(D) & \cdots & G_{2n}(D) \\ \vdots & \vdots & \ddots & \vdots \\ G_{k1}(D) & G_{k2}(D) & \cdots & G_{kn}(D) \end{bmatrix} \quad \text{(Equation 1)}$$

An element $G_{ij}(D)$ of G(D) will be described in the following manner as a polynomial for D of the degree v(ij) with elements $g_{ij0}, g_{ij1}, \ldots, g_{ij(v(ij))}$ over GF(q) as coefficients.

$G_{ij}(D)$ is represented as follows:

$G_{ij}(D)=g_{ij0}+g_{ij1}D+ \ldots +g_{ij(v(ij))}D^{v(ij)}$ where $g_{ij(v(ij))} \ne 0$.

In the present invention, k and n, which satisfy lk≦n with respect to an integer l greater than or equal to 2 in the convolutional codes represented in the above-described manner, are selected. Further, n', which satisfies n'≦∥n/l∥ and n'≧k, is selected. However, ∥x∥ is the maximum positive number not exceeding x.

Now consider where l=2. In this condition, the encoder 013 of the wireless transmitting station 01 effects encoding based on the following transfer function matrix $G^1(D)$ on an input data sequence $m_0 m_1 \ldots m_{N-1}$ to thereby obtain a code word $c^1$.

$$G^1(D) = \begin{bmatrix} G_{11}(D) & G_{12}(D) & \cdots & G_{1n'}(D) \\ G_{21}(D) & G_{22}(D) & \cdots & G_{2n'}(D) \\ \vdots & \vdots & \ddots & \vdots \\ G_{k1}(D) & G_{k2}(D) & \cdots & G_{kn'}(D) \end{bmatrix} \quad \text{(Equation 2)}$$

where $c^1 = w^1_0 w^1_1 \ldots w^1_{N-1}$, $w^1_t$ (t=0, 1, ..., N−1) indicates a sequence over GF(q) having a length n, and $w^1_t = (w^1_{t1}, w^1_{t2}, \ldots, w^1_{n't})$.

Further, the encoder 023 of the wireless transmitting station 02 effects encoding based on the following transfer function matrix $G^2(D)$ on the same data sequence $m_0 m_1 \ldots m_{N-1}$ to thereby obtain a code word $c^2$.

$$G^2(D) = \begin{bmatrix} G_{1(n'+1)}(D) & G_{1(n'+2)}(D) & \cdots & G_{1(2n')}(D) \\ G_{2(n'+1)}(D) & G_{2(n'+2)}(D) & \cdots & G_{2(2n')}(D) \\ \vdots & \vdots & \ddots & \vdots \\ G_{k(n'+1)}(D) & G_{k(n'+2)}(D) & \cdots & G_{k(2n')}(D) \end{bmatrix} \quad \text{(Equation 3)}$$

where $c^2 = w^2_0 w^2_1 \ldots w^2_{N-1}$, $w^2_t$ (t=0, 1, ..., N−1) indicates a sequence over GF(q) having a length n, and $w^2_t = (w^2_{(n'+1)t}, w^2_{(n'+2)t}, \ldots, w^2_{(2n')t})$.

The transfer function matrixes $G^1(D)$ and $G^2(D)$ respectively provide convolutional codes $C_1$ and $C_2$ each given at the code rate k/n'.

The decoding of the decoders 2161 and 2162 of the wireless receiving station 21 is performed by applying the conventional decoding method (e.g., the Viterbi decoding algorithms) of convolutional codes with respect to encoding based on the transfer function matrixes $G^1(D)$ and $G^2(D)$.

The data combiner 217 of the wireless receiving station 21 combines received data sequences $r^1 = r^1_0 r^1_1 \ldots r^1_{N-1}$ to $r^2 = r^2_0 r^2_1 \ldots r^2_{N-1}$ read from the buffers 2131 and 2132 into one and inputs the combined received data sequence $$(r^1 r^2) = (r^1_0 r^2_0 r^1_1 r^2_1 \ldots r^1_{N-1} r^2_{N-1})$$

to the decoder 2160. In practice, the combined received data sequence $(r^1 r^2)$ results in a sequence obtained by addition of some error sequence on a communication channel to a code word generated by the following transfer function matrix $G^{12}(D)$.

$$G^{12}(D) = \begin{bmatrix} G_{11}(D) & G_{12}(D) & \cdots & G_{1(2n')}(D) \\ G_{21}(D) & G_{22}(D) & \cdots & G_{2(2n')}(D) \\ \vdots & \vdots & \ddots & \vdots \\ G_{k1}(D) & G_{k2}(D) & \cdots & G_{k(2n')}(D) \end{bmatrix} \quad \text{(Equation 4)}$$

The transfer function matrix $G^{12}(D)$ provides a convolutional code $C_{12}$ given at the code rate k/(2n'). Thus the convolutional code $C_{12}$ includes much stronger error correcting capability as compared with the convolutional codes $C_1$ and $C_2$. In other words, when the data sent from the wireless transmitting stations 01 and 02 are received from both the radio channels, the data can be decoded as a code word provided with much stronger error correcting capability as compared with when received only from either one of the transmitting stations. The decoding of the decoder 2160 is performed by applying the conventional decoding method (e.g., the Viterbi decoding algorithms) of convolutional codes with respect to the transfer function matrix $G^{12}(D)$.

If convolutional codes are generated over GF(2) with, for example, n'=1 and k=1 and the transfer function matrixes $G^1(D) = [1+D^2+D^3+D^4+D^8]$ and $G^2(D) = [1+D+D^2+D^3+D^5+D^7+D^8]$ in the second embodiment, then they correspond to encoding by a linear-feedforward shift register and error correcting capability thereof is equal to nothing. However, since the reverse encoding processes by linear-feedforward shift register may be executed as the decoding processes of the decoders 2161 and 2162 respectively, the decoders 2161 and 2162 can be simplified in structure. On the other hand, the transfer function matrix $G^{12}(D)$ results in $G^{12}(D) = [G^1(D) \; G^2(D)] = [1+D^2+D^3+D^4+D^8 \; 1+D+D^2+D^3+D^5+D^7+D^8]$ and provides binary convolutional codes in which the code rate is ½ and the minimum free distance is 12. In the second embodiment, data about the end $m_{N-V+1} m_{N-V+2} \ldots m_{N-1}$ of the input data sequence $m_0 m_1 \ldots m_{N-1}$ may be all set to zero as one method of terminating the Viterbi decoding algorithms. Here, V indicates the constraint length of the convolutional code $C_{12}$.

Applications according to the present invention will next be described. In the foregoing embodiments, if either the radio channels 11 or 12 is satisfactory in a received state even when the data sent from the wireless transmitting stations 01 and 02 are received from both the radio channels, then desired data can be obtained only from the received data of the satisfactory one. This means that desired output data can be obtained by much simpler processes of the decoders 2161 and 2162 without decoder 2160. As a method of checking the states of reception of the radio channels 11 and 12, may be mentioned (1) a method using a received signal strength value and (2) an error detection-based method.

One embodiment based on "(1) the method using the received signal strength value" will first be described as the first application according to the present invention with reference to FIG. 2. If the present embodiment shown in the same drawing is compared with FIG. 1 illustrative of one example of the diversity wireless communication apparatus, then the differences reside in a receiver 212' of a wireless receiving station 21', buffers 2131' and 2132' and a selector A 2151' in a decoding unit 216'. The receiver 212' outputs even received signal strength value obtained upon their reception at the respective radio channels in connection with the output of data received through the respective radio channels. The buffers 2131' and 2132' respectively store therein the received signal strength value at their reception at the radio channels 11 and 12. The selector A 2151' checks for the presence or absence of received data in buffers 2131 and 2132. If it is found that the data has been stored in the buffer 2131 alone, then the selector A 2151' reads it and inputs the received data to a decoder 2161. If it is found that the data has been stored in the buffer 2132 alone in reverse, then the selector A 2151' reads it and inputs the received data to a decoder 2162. Further, when the selector A 2151' checks for the presence or absence of the received data in the buffers 2131 and 2132 and detects the storage of the data in both the buffers 2131 and 2132, the selector A 2151' reads the received signal strength value from the buffer 2131' and compares it with a predetermined reference value. If the received signal strength value is found to exceed the reference value from the above comparison, then the selector A 2151' reads the received data from the buffer 2131 and inputs it to the decoder 2161. On the other hand, when the received signal strength value is found not to exceed the reference value, the selector A 2151' reads the received signal strength value from the buffer 2132' and compares it with a predetermined reference value. If the received signal strength value is found to exceed the reference value from the above comparison, then the selector A 2151' reads the received data from the buffer 2132 and inputs it to the decoder 2162. When any of the received signal strength value read from the buffers 2131' and 2132' is found not to exceed the reference value from the result of the comparison, the selector A 2151' reads the received data from both the buffers 2131 and 2132 respectively and input them to a data combiner 217.

Figure 2:
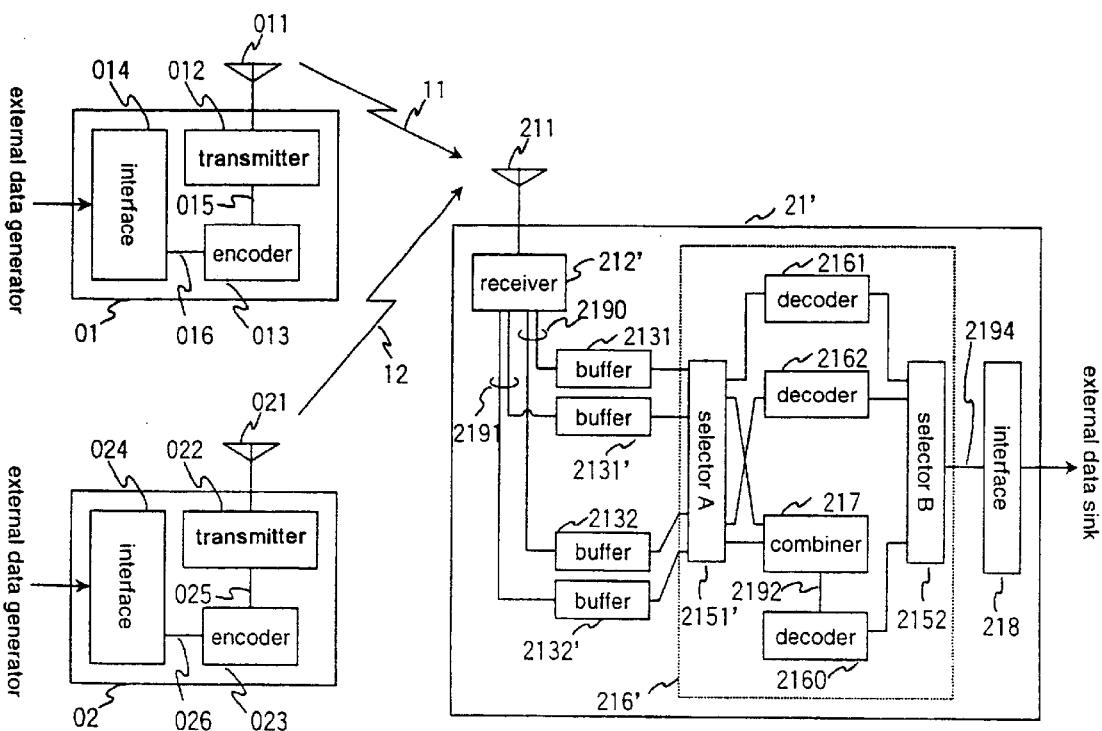
FIG. 2 is a diagram for describing another example of a diversity radio communication apparatus according to the present invention.

Thus, the adoption of the configuration shown in FIG. 2 allows a decision as to the states of the radio channels 11 and 12 at their reception. When the received state of either the radio channels 11 or 12 is found to be satisfactory where the data sent from the wireless transmitting stations 01 and 02 are received from both the radio channels, only the received data from one thereof in which the received state is found to be satisfactory, can be applied to the corresponding decoder.

One embodiment based on "(2) the error detection-based method" will next be described as the second application according to the present invention with reference to FIG. 3. If the present embodiment shown in the same drawing is compared with FIG. 1 illustrative of one example of the diversity wireless communication apparatus according to the present invention, then the differences reside in encoders 013" and 023" of wireless transmitter or transmitting stations 01" and 02", a selector A 2151" in a decoding unit 216' of a wireless receiving station 21", and detectors 2141 and 2142. First of all, the encoders 013" and 023" respectively generate only a predetermined code word fragment for an error correcting code from one data sequence as in the case of the encoders 013 and 023. Further, the encoders 013" and 023" respectively output ones obtained by calculating an error detecting check bit and applying it. However, when such an encoding method that the generated arbitrary code word fragment itself has suitable error detecting capability is adopted in the process of generating only the predetermined code word fragment for the error correcting code from one data sequence, the process for calculating the error detecting check bit and applying it may be omitted. It is of importance that the encoding done by the encoders 013" and 023" is associated with injection but not with surjection. The detectors 2141 and 2142 in the receiver 21" respectively check for the presence or absence of received data stored in buffers 2131 and 2132. When the received data exist in the buffers 2131 and 2132, the detectors 2141 and 2142 respectively read the received data therefrom and calculate their syndrome in association with their encoding of the encoders 013" and 023" and output the presence or absence of error detection to the selector A 2151". The selector A 2151" checks for the presence or absence of received data in the buffers 2131 and 2132. If the data is stored in the buffer 2131 alone, then the selector A 2151" reads it and inputs the received data to a decoder 2161. If the data is found to have been stored in the buffer 2132 alone in reverse, then the selector A 2151" reads it and inputs the received data to a decoder 2162. When the selector A 2151" checks for the presence or absence of the received data in the buffers 2131 and 2132 and consequently detects the storage of the data in both the buffers 2131 and 2132, the selector A 2151" refers to the result of error detection from the detector 2141. If the error detection is found to be nil, then the selector A 2151" reads the received data from the buffer 2131 and inputs it to the decoder 2161. On the other hand, when the error detection is found to have been made, the selector A 2151" next refers to the result of error detection from the detector 2142. If the error detection is found to be nil, then the selector A 2151" reads the received data from the buffer 2132 and inputs it to the decoder 2162. If it is found that an error has been detected from both of the detectors 2141 and 2142, then the selector A 2151" reads the received data from both the buffers 2131 and 2132 respectively and inputs the same to a data combiner 217.

Figure 3:
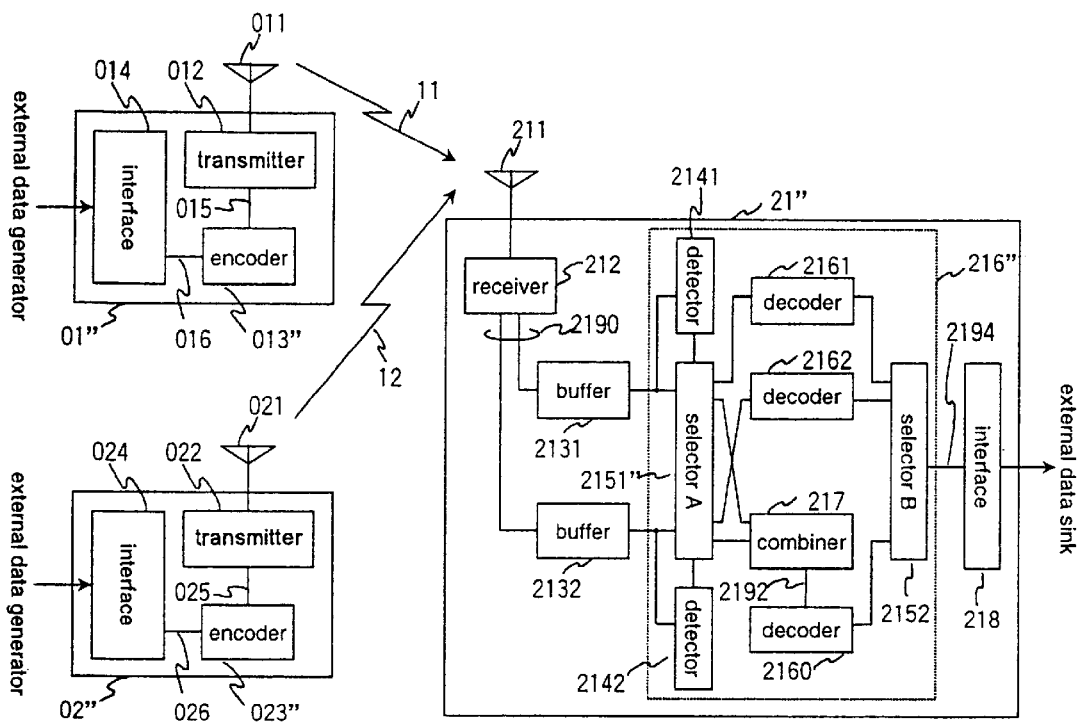
FIG. 3 is a diagram for describing a further example of a diversity radio communication apparatus according to the present invention.

Thus, the adoption of the configuration shown in FIG. 3 allows a decision as to the states of the radio channels 11 and 12 at their reception. When the received state of either the radio channels 11 or 12 is found to be satisfactory where the data sent from the wireless transmitting stations 01 and 02 are received from both the radio channels, only the received data from one thereof in which the received state is found to be satisfactory, can be applied to the corresponding decoder.

Figure 4:
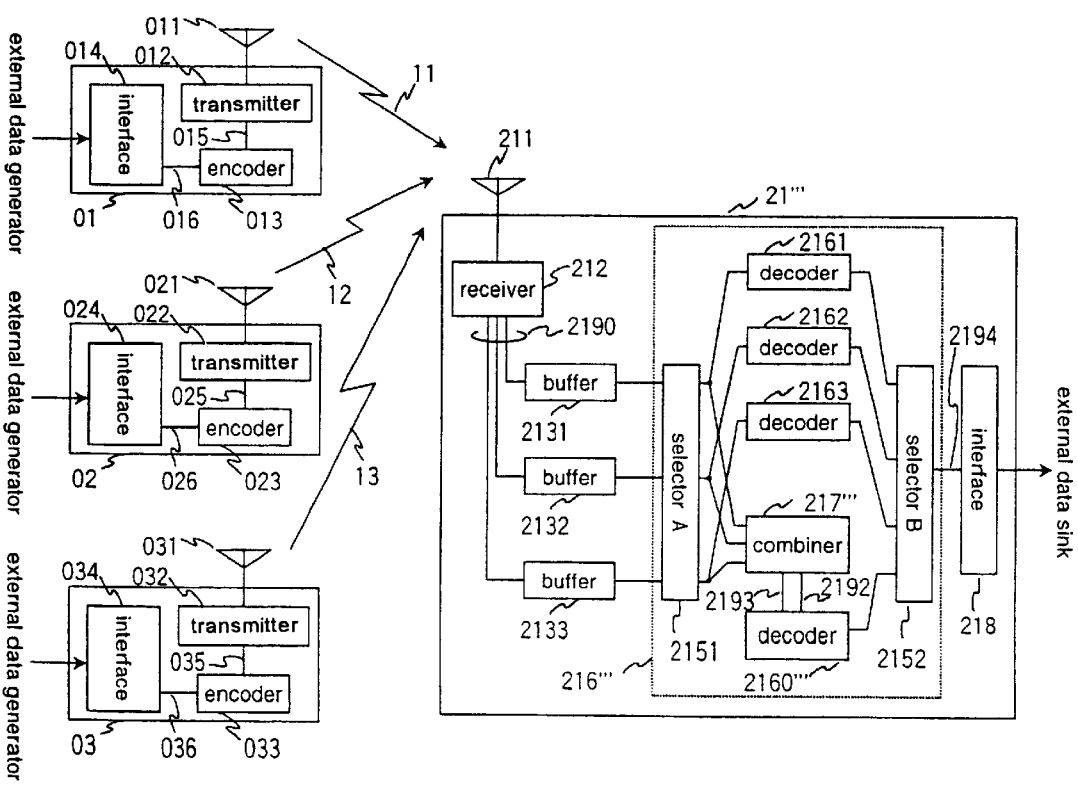
FIG. 4 is a diagram for describing a still further example of a diversity radio communication apparatus according to the present invention.

While all the above-described embodiments have shown the case in which the two wireless transmitting stations respectively transmit the data to the wireless receiving station through one radio channel, the number of the wireless transmitting stations is not limited to two in the present invention. An embodiment in which three wireless transmitting stations respectively transmit data to their corresponding wireless receiving station through one radio channel, is shown in FIG. 4 as the third application according to the present invention. In the same drawing, reference numerals 01 through 03 indicate wireless transmitting stations respectively, and reference numeral 21''' indicates a wireless receiving station.

In the wireless transmitting station 01, the data input interface 014 controls the input of data between an external data generator and the encoder 013. The encoder 013 performs encoding on the input data 016 to output a code word 015. An encoding method of the encoder 013 is determined according to the radio channel 11 used by the transmitter 012 but the details thereof will be described later. The transmitter 012 performs conversion to a radio signal format, modulation, frequency conversion, filter processing and amplification on the code word 015 and thereafter transmits the processed code word through the antenna 011. In the wireless transmitting station 02, a data input interface 024 controls the input of data between an external data generator and the encoder 023. The encoder 023 performs encoding on input data 026 to output a code word 025. An encoding method of the encoder 023 is determined according to the radio channel 12 used by the transmitter 022 but the details thereof will be described later. The transmitter 022 performs conversion to a radio signal format, modulation, frequency conversion, filter processing and amplification on the code word 025 and thereafter transmits the processed code word through an antenna 021. In a wireless transmitting station 03, a data input interface 034 controls the input of data between an external data generator and an encoder 033. The encoder 033 performs encoding on input data 036 to output a code word 035. An encoding method of the encoder 033 is determined according to a radio channel 13 used by a transmitter 032 but the details thereof will be described later. The transmitter 032 performs conversion to a radio signal format, modulation, frequency conversion, filter processing and amplification on the code word 035 and thereafter transmits the processed code word through an antenna 031. The wireless transmitting stations 01 through 03 are different from one another in the radio channels 11 through 13 used by their corresponding transmitters 012, 022 and 032 and the encoding methods employed in their corresponding encoders 013, 023 and 033. Here, the radio channels 11 through 13 are not necessarily limited to hose specified by frequencies and also include those specified by time slots or spread spectrum codes.

In the wireless receiving station 21''', reference numeral 212 indicates a receiver and has the function of independently receiving signals for the radio channels 11 through 13 through the antenna 211. The receiver 212 performs amplification, frequency conversion, filter processing, demodulation and conversion from a radio signal format to received data 2190 on the received signals on the radio channels 11 through 13. If the received radio channel is found to be 11, then the receiver 212 temporarily stores the received data 2190 in the buffer 2131. If the received radio channel is found to be 12, then the receiver 212 temporarily stores the received data 2190 in the buffer 2132. If the received radio channel is found to be 13, then the receiver 212 temporarily stores the received data 2190 in a buffer 2133. Next, the received data temporarily stored in the buffers 2131 through 2133 are read and decoded by a decoding unit 216'''. How to decode the data here is determined according to receiving conditions at the radio channels 11 through 13 and the encoding methods of the wireless stations 01 through 03 but the details thereof will be described later. The data output interface 218 performs control for outputting output data decoded by the decoding unit 216''' to an external data sink.

The operation of the decoding unit 216''' will next be explained in detail. Since radio propagation environments in mobile communications change moment by moment, the receiving station is not always able to receive desired data from all the radio channels 11 through 13. When the data sent from the wireless transmitting stations 01 through 03 are received only from either one of the radio channels, the received data is stored in either one of the buffers 2131 through 2133 according to the radio channel having received the corresponding data therethrough. A selector A 2151 checks for the presence or absence of the received data in the buffers 2131 through 2133. If it is found that the data has been stored in the buffer 2131 alone, then the selector A 2151 reads it and inputs the received data to the decoder 2161. On the other hand, when it is found that the data has been stored in the buffer 2132 alone, the selector A 2151 reads it and inputs the received data to the decoder 2162. Alternatively, if it is found that the data has been stored in the buffer 2133 alone, then the selector A 2151 reads it and inputs the received data to a decoder 2163. The decoders 2161 through 2163 are respectively decoders corresponding to the encoding methods of the encoders 013, 023 and 033. A decision as to which decoding method in the decoders should be applied, is made according to the encoding methods employed in the wiring stations 01 through 03 but the details thereof will be explained later. When the data from the wireless transmitting stations 01 through 03 are received from a plurality of radio channels, the received data are respectively stored in the buffers 2131 through 2133 corresponding to the radio channels having received the corresponding data. The selector A 2151 checks for the presence or absence of the received data lying within the buffers 2131 through 2133 and detects the storage of the data in the plurality of buffers 2131 through 2133. Further, the selector A 2151 reads the received data from the plurality of buffers respectively and inputs the same to the data combiner 217'''. The data combiner 217''' integrates and combines the plurality of received data obtained from the buffers 2131 through 2133 and outputs combined received data 2192 and integrated information 2193 indicative of which received data is integrated. A decoder 2160''' decodes the combined received data 2192, based on the integrated information 2193 from the data combiner 217'''. How to integrate, combine and decode the data here is determined depending on the encoding methods employed in the wiring stations 01 through 03 and a decision as to which radio channel have receives data, but the details thereof will be described later.

Summaries of the encoding methods of the encoders 013, 023 and 033 in the wireless transmitting stations 01 through 03 and the data combining/decoding methods of the data combiner 217''' and decoders 2161 through 2163 and 2160''' in the wireless receiving station 21 will consecutively be explained. Examples of actual encoding/decoding methods will be described later. The encoding methods of the encoders 013, 023 and 033 will first be described. Each of the encoders 013, 023 and 033 performs a process equivalent to the fact that a code word in an error correcting code is generated from one input data sequence and divided into three, and one of predetermined three fragments is outputted. Described specifically, the encoders 013, 023 and 033 generate only a predetermined code word fragment from one input data sequence and outputs it therefrom. However, since the wireless receiving station does not always receive three signals transmitted from the wireless transmitting stations 01 through 03, a limitation is imposed on the encoding method so that the data sequence can be decoded even from one fragment alone. Described specifically, mapping from the data sequence to the fragment of the code word is limited to injection. The decoding methods employed in the decoders 2161 through 2163 will next be described. The decoders 2161 through 2163 respectively perform decoding processes corresponding to the encoding methods of the encoders 013, 023 and 033. Particularly when maps in the encoders 013, 023 and 033 are respectively isomorphism, the decoding processes of the decoders 2161 through 2163 result in matrix multiplication. The data combining method of the data combiner 217 will continuously be described. The wireless transmitting stations 01 through 03 respectively generate a code word in an error correcting code from one input data sequence and divide the code word into three. Further, they respectively transmit respective fragments of the divided code words through the radio channels 11 through 13 different from each other therefrom. Therefore, when the fragments of the divided code words are received by the wireless receiving station 21''', the wireless receiving station 21''' is able to specify either of the fragments thereof according to the received radio channel. When the three fragments of the divided code words are all received by the wireless receiving station 21''', the data combiner 217''' performs an operation opposite to the dividing procedure defined in advance to thereby re-arrange sort the received ones in a manner similar to the code words before division generated in the wireless transmitting stations 01 through 03. When the wireless receiving station 21''' receives two of the fragments of the divided code words, the two received data are re-arranged by a predetermined procedure according to the received data. A decoding method of the 2160''' will be explained. When all the fragments of the code words are available, the decoder 2160''' performs a decoding process corresponding to the method of encoding the code words before division generated in the wireless transmitting stations 01 through 03. When the two of the fragments of the code words are available, the decoder 2160''' performs a decoding process corresponding to an encoding method obtained by modifying the method of encoding each pre-division code word before division. Here, the encoding method obtained by modifying the method of encoding each code word before division is equivalent specifically to puncturing of the code. Since such puncturing of the code shows the case in which the two of the three fragments of the code words are available, three possible processes, i.e., $_3C_2=3$ exist. Thus, three possible decoding processes to be executed by the decoder 2160''' at the time that the two of the fragments of the code words are available, exist. Further, the number of the decoding processes exists four as a whole when the decoding process at the time that all the fragments of the code words are available, is included. Which decoding process should be effected on the combined received data 2192 by the decoder 2160''', is based on the integrated information 2193 of the data combiner 217'''.

An example of the actual encoding/decoding method will be explained. In the first embodiment, for example, l=3 and the encoder 013 of the wireless transmitting station 01 effects encoding based on the following map $\Phi_1$ on an input data sequence u to thereby obtain a code word $c^1$.

$$\Phi_1: L(G) \ni f \rightarrow (f(P_1), f(P_2), \ldots, f(P_{n'})) = c^1 \in F^{n'}$$

Further, the encoder 023 of the wireless transmitting station 02 effects encoding based on the following map $\Phi_2$ on the same data sequence u to thereby obtain a code word $c^2$.

$$\Phi_2: L(G) \ni f \rightarrow (f(P_{n'+1}), f(P_{n'+2}), \ldots, f(P_{2n'})) = c^2 \in F^{n'}$$

Furthermore, the encoder 033 of the wireless transmitting station 03 effects encoding based on the following map $\Phi_3$ on the same data sequence u to thereby obtain a code word $c^3$.

$$\Phi_3: L(G) \ni f \rightarrow (f(P_{2n'+1}), f(P_{2n'+2}), \ldots, f(P_{3n'})) = c^3 \in F^{n'}$$

The above-described maps $\Phi_1$ through $\Phi_3$ respectively provide q-ary (n', m-g) linear codes $C_1$ through $C_3$ in which a code length is given as n' and the number of information symbols is given as (m-g). Each of the designed distance about the present codes according to V. D. Goppa, i.e., $d_{C1} = d_{C2} = d_{C3} = n' - m + 1$.

Decoding of the decoders 2161 through 2163 in the wireless receiving station 21''' is carried out by applying the conventional decoding method (see e.g., T. Høholdt & R. Pellikaan, "On the Decoding of Algebraic Geometry Codes", IEEE Transactions on Information Theory, Volume 41, Number 6, pp. 1589–1614) of algebraic-geometric codes with respect to the maps $\Phi_1$ through $\Phi_3$.

The data combiner 217''' of the wireless receiving station 21''' combines received data sequences $r^1 = (r^1_1, r^1_2, \ldots, r^1_{n'})$, $r^2 = (r^2_1, r^2_2, \ldots, r^2_{n'})$, and $r^3 = (r^3_1, r^3_2, \ldots, r^3_{n'})$ read from the buffers 2131 through 2133 into one. As to how to combine them, however, the following four of (1) through (4) exist according to the conditions of reception.

(1) when $r^1$, $r^2$ and $r^3$ are available:
A sequence $(r^1 r^2 r^3) = (r^1_1, r^1_2, \ldots, r^1_{n'}, r^2_1, r^2_2, \ldots, r^2_{n'}, r^3_1, r^3_2, \ldots, r^3_{n'})$ is generated and inputted to the decoder 2160'''.

(2) when $r^1$ and $r^2$ are available:
A sequence $(r^1 r^2) = (r^1_1, r^1_2, \ldots, r^1_{n'}, r^2_1, r^2_2, \ldots, r^2_{n'})$ is generated and inputted to the decoder 2160'''.

(3) when $r^2$ and $r^3$ are available:
A sequence $(r^2 r^3) = (r^2_1, r^2_2, \ldots, r^2_{n'}, r^3_1, r^3_2, \ldots, r^3_{n'})$ is generated and inputted to the decoder 2160'''.

(4) when $r^1$ and $r^3$ are available:
A sequence $(r^1 r^3) = (r^1_1, r^1_2, \ldots, r^1_{n'}, r^3_1, r^3_2, \ldots, r^3_{n'})$ is generated and inputted to the decoder 2160'''.

The sequence $(r^1 r^2 r^3)$ results in a sequence obtained by addition of some error sequence on each communication channel to a code word of a q-ary (3n', m-g) linear code $C_{123}$ given by the following map.

$$\Phi_{123}: L(G) \ni f \rightarrow (f(P_1), f(P_2), \ldots, f(P_{3n'})) \in F^{3n'}$$

The sequence $(r^1 r^2)$ results in a sequence obtained by addition of some error sequence on each communication channel to a code word of a q-ary (2n', m-g) linear code $C_{12}$ given by the following map.

$$\Phi_{12}: L(G) \ni f \rightarrow (f(P_1), f(P_2), \ldots, f(P_{2n'})) \in F^{2n'}$$

The sequence $(r^2 r^3)$ results in a sequence obtained by addition of some error sequence on each communication channel to a code word of a q-ary (2n', m-g) linear code $C_{23}$ given by the following map.

$$\Phi_{23}: L(G) \ni f \rightarrow (f(P_{n'+1}), f(P_{n'+2}), \ldots, f(P_{3n'})) \in F^{2n'}$$

The sequence $(r^1 r^3)$ results in a sequence obtained by addition of some error sequence on each communication channel to a code word of a q-ary (2n', m-g) linear code $C_{13}$ given by the following map.

$$\Phi_{13}: L(G) \ni f \rightarrow (f(P_1), f(P_2), \ldots, f(P_{n'}), f(P_{2n'+1}), f(P_{2n'+2}), \ldots, f(P_{3n'})) \in F^{2n'}$$

Since designed distances about the linear codes $C_{12}$, $C_{23}$ and $C_{13}$ according to V. D. Goppa become $d_{C12} = d_{C23} = d_{C13} = 2n' - m + 1$, the linear codes $C_{12}$, $C_{23}$ and $C_{13}$ include much stronger error correcting capability as compared with the linear codes $C_1$ through $C_3$. In other words, when the data sent from the wireless transmitting stations 01 through 03 are received from the two radio channels, the data can be decoded as a code word provided with much stronger error correcting capability as compared with when received only from either one of the transmitting stations. Further, since the designed distance of the linear code $C_{123}$ according to V. D. Goppa becomes $d_{C123} = 3n' - m + 1$, the linear code $C_{123}$ includes much stronger error correcting capability as compared with the linear codes $C_{12}$, $C_{23}$ and $C_{13}$. In other words, when the data sent from the wireless transmitting stations 01 through 03 are received from all the radio channels, the data can be decoded as a code word provided with much stronger error correcting capability as compared with when received only from the two transmitting stations at the most. Now, the linear codes $C_{12}$, $C_{23}$ and $C_{13}$ correspond to punctured codes obtained by puncturing a parity check part by an n' symbol from the linear code $C_{123}$. Incidentally, the decoding of the decoder 2160''' is performed by applying the conventional decoding method (see e.g., T. Høholdt & R. Pellikaan, "On the Decoding of Algebraic Geometry Codes", IEEE Transactions on Information Theory, Volume 41, Number 6, pp. 1589–1614) of algebraic-geometric codes with respect to the respective maps $\Phi_{12}$, $\Phi_{23}$, $\Phi_{13}$ and $\Phi_{123}$.

An example of another encoding/decoding method will next be explained. In the second embodiment, l=3, for example. Further, the encoder 013 of the wireless transmitting station 01 effects encoding based on the following transfer function matrix $G^1(D)$ on an input data sequence $m_0 m_1 \ldots m_{N-1}$ to thereby obtain a code word $c^1$.

$$G^1(D) = \begin{bmatrix} G_{11}(D) & G_{12}(D) & \cdots & G_{1n'}(D) \\ G_{21}(D) & G_{22}(D) & \cdots & G_{2n'}(D) \\ \vdots & \vdots & \ddots & \vdots \\ G_{kl}(D) & G_{k2}(D) & \cdots & G_{kn'}(D) \end{bmatrix} \quad \text{(Equation 5)}$$

where $c^1 = w^1_0 w^1_1 \ldots w^1_{N-1}$, and $w^1_t$ (t=0, 1, ..., N-1) indicates a sequence over GF(q) having a length, i.e., $w^1_t = (w^1_{1t}, w^1_{2t}, \ldots, w^1_{n't})$.

Further, the encoder 023 of the wireless transmitting station 02 effects encoding based on the following transfer function matrix $G^2(D)$ on the same data sequence $m_0 m_1 \ldots m_{N-1}$ to thereby obtain a code word $c^2$.

$$G^2(D) = \begin{bmatrix} G_{1(n'+1)}(D) & G_{1(n'+2)}(D) & \cdots & G_{1(2n')}(D) \\ G_{2(n'+1)}(D) & G_{2(n'+2)}(D) & \cdots & G_{2(2n')}(D) \\ \vdots & \vdots & \ddots & \vdots \\ G_{k(n'+1)}(D) & G_{k(n'+2)}(D) & \cdots & G_{k(2n')}(D) \end{bmatrix} \quad \text{(Equation 6)}$$

where $c^2 = w^2_0 w^2_1 \ldots w^2_{N-1}$, and $w^2_t$ (t=0, 1, ..., N-1) indicates a sequence over GF(q) having a length n, i.e., $w^2_t = (w^2_{(n'+1)t}, w^2_{(n'+2)t}, \ldots, w^2_{(2n')t})$.

Further, the encoder 033 of the wireless transmitting station 03 effects encoding based on the following transfer function matrix $G^3(D)$ on the same data sequence $m_0 m_1 \ldots m_{N-1}$ to thereby obtain a code word $c^3$.

$$G^3(D) = \begin{bmatrix} G_{1(2n'+1)}(D) & G_{1(2n'+2)}(D) & \cdots & G_{1(3n')}(D) \\ G_{2(2n'+1)}(D) & G_{2(2n'+2)}(D) & \cdots & G_{2(3n')}(D) \\ \vdots & \vdots & \ddots & \vdots \\ G_{k(2n'+1)}(D) & G_{k(2n'+2)}(D) & \cdots & G_{k(3n')}(D) \end{bmatrix} \quad \text{(Equation 7)}$$

where $c^3 = w^3_0 w^3_1 \ldots w^3_{N-1}$, and $w^3_t$ (t=0, 1, ..., N-1) indicates a sequence over GF(q) having a length n, i.e. $w^3_t = (w^3_{(2n'+1)t}, w^3_{(2n'+2)t}, \ldots, w^3_{(3n')t})$.

The transfer function matrixes $G^1(D)$ through $G^3(D)$ respectively provide convolutional codes $C_1$ through $C_3$ each given at an code rate k/n'.

The decoding of the decoders 2161 through 2163 of the wireless receiving station 21''' is performed by applying the conventional decoding method (e.g., the Viterbi decoding algorithms) of convolutional codes with respect to encoding based on the transfer function matrixes $G^1(D)$ through $G^3(D)$.

The data combiner 217''' of the wireless receiving station 21''' combines received data sequences $r^1 = r^1_0, r^1_1 \ldots r^1_{N-1}$, $r^2 = r^2_0, r^2_1 \ldots r^2_{N-1}$, and $r^3 = r^3_0, r^3_1 \ldots r^3_{N-1}$ read from the buffers 2131 through 2133 into one. As to how to combine them, however, the following four of (1) through (4) exist according to the conditions of reception.

(1) when $r^1$, $r^2$ and $r^3$ are available:

A sequence $(r^1 r^2 r^3) = (r^1_0 r^2_0 r^3_0 r^1_1 r^2_1 r^3_1 \ldots r^1_{N-1} r^2_{N-1} r^3_{N-1})$ is generated and inputted to the decoder 2160'''.

(2) when $r^1$ and $r^2$ are available:

A sequence $(r^1 r^2) = (r^1_0 r^2_0 r^1_1 r^2_1 \ldots r^1_{N-1} r^2_{N-1})$ is generated and inputted to the decoder 2160'''.

(3) when $r^2$ and $r^3$ are available:

A sequence $(r^2 r^3) = (r^2_0 r^3_0 r^2_1 r^3_1 \ldots r^2_{N-1} r^3_{N-1})$ is generated and inputted to the decoder 2160'''.

(4) when $r^1$ and $r^3$ are available:

A sequence $(r^1 r^3) = (r^1_0 r^3_0 r^1_1 r^3_1 \ldots r^1_{N-1} r^3_{N-1})$ is generated and inputted to the decoder 2160'''.

The sequence $(r^1 r^2 r^3)$ results in a sequence obtained by addition of some error sequence on each communication channel to a code word generated by the following transfer function matrix $G^{123}(D)$.

$$G^{123}(D) = \begin{bmatrix} G_{11}(D) & G_{12}(D) & \cdots & G_{1(3n')}(D) \\ G_{21}(D) & G_{22}(D) & \cdots & G_{2(3n')}(D) \\ \vdots & \vdots & \ddots & \vdots \\ G_{kJ}(D) & G_{k2}(D) & \cdots & G_{k(3n')}(D) \end{bmatrix} \quad \text{(Equation 8)}$$

The sequence $(r^1 r^2)$ results in a sequence obtained by addition of some error sequence on each communication channel to a code word generated by the following transfer function matrix $G^{12}(D)$.

$$G^{12}(D) = \begin{bmatrix} G_{11}(D) & G_{12}(D) & \cdots & G_{1(2n')}(D) \\ G_{21}(D) & G_{22}(D) & \cdots & G_{2(2n')}(D) \\ \vdots & \vdots & \ddots & \vdots \\ G_{kJ}(D) & G_{k2}(D) & \cdots & G_{k(2n')}(D) \end{bmatrix} \quad \text{(Equation 9)}$$

The sequence $(r^2 r^3)$ results in a sequence obtained by addition of some error sequence on each communication channel to a code word generated by the following transfer function matrix $G^{23}(D)$.

$$G^{23}(D) = \begin{bmatrix} G_{1(n'+1)}(D) & G_{1(n'+2)}(D) & \cdots & G_{1(3n')}(D) \\ G_{2(n'+1)}(D) & G_{2(n'+2)}(D) & \cdots & G_{2(3n')}(D) \\ \vdots & \vdots & \ddots & \vdots \\ G_{k(n'+1)}(D) & G_{k(n'+2)}(D) & \cdots & G_{k(3n')}(D) \end{bmatrix} \quad \text{(Equation 10)}$$

The sequence $(r^1 r^3)$ results in a sequence obtained by addition of some error sequence on each communication channel to a code word generated by the following transfer function matrix $G^{13}(D)$.

$$G^{13}(D) = \begin{bmatrix} G_{11}(D) & G_{12}(D) & \cdots & G_{1n'}(D) & G_{1(2n'+1)}(D) & G_{1(2n'+2)}(D) & \cdots & G_{1(3n')}(D) \\ G_{21}(D) & G_{22}(D) & \cdots & G_{2n'}(D) & G_{2(2n'+1)}(D) & G_{2(2n'+2)}(D) & \cdots & G_{2(3n')}(D) \\ \vdots & \vdots & \ddots & \vdots & \vdots & \vdots & \ddots & \vdots \\ G_{kJ}(D) & G_{k2}(D) & \cdots & G_{kn'}(D) & G_{k(2n'+1)}(D) & G_{k(2n'+2)}(D) & \cdots & G_{k(3n')}(D) \end{bmatrix} \quad \text{(Equation 11)}$$

The transfer function matrixes $G^{12}(D)$, $G^{23}(D)$ and $G^{13}(D)$ respectively provide convolutional codes $C_{12}$, $C_{23}$ and $C_{13}$ each given at an code rate k/(2n'). Thus the convolutional codes $C_{12}$, $C_{23}$ and $C_{13}$ respectively include much stronger error correcting capability as compared with the convolutional codes $C_1$ through $C_3$. In other words, when the data sent from the wireless transmitting stations 01 through 03 are received from the two radio channels, the data can be decoded as a code word provided with much stronger error correcting capability as compared with when received only from either one of the transmitting stations. Further, the transfer function matrix $G^{123}(D)$ provides a convolutional code $C_{123}$ given at a code rate k/(3n'). Thus, the convolution code $C_{123}$ provides much stronger error correcting capability as compared with the convolutional codes $C_1$ through $C_3$ and $C_{12}$, $C_{23}$ and $C_{13}$. In other words, when the data sent from the wireless transmitting stations 01 through 03 are received from all the radio channels, the data can be decoded as a code word provided with much stronger error correcting capability as compared with when received only from the two transmitting stations at most.

Incidentally, the decoding of the decoder 2160''' is performed by applying the conventional decoding method (e.g., the Viterbi decoding algorithms) of convolutional codes with respect to respective encoding based on the transfer function matrixes $G^{12}(D)$, $G^{23}(D)$, $G^{13}(D)$ and $G^{123}(D)$.

While the third application according to the present invention has shown the case in which the three wireless transmitting stations respectively transmit the data to the wireless receiving station through one radio channel, application to the case in which m wireless transmitting stations normally respectively transmit data to a wireless receiving station through one radio channel, is easy. A summary thereof in this case will be described. First, m radio channels are set, and m wireless transmitting stations respectively generate a code word in the same error correcting code from one input data sequence and divide it into m. Further, the m wireless transmitting stations respectively transmit one of predetermined m fragments to a wireless receiving station through one of predetermined m radio channels. The wireless receiving station is provided with m buffers corresponding to the respective radio channels. Decoding is performed by decoders having decoding processing methods corresponding to the number of combinations of the resultant code word fragments, according to the conditions of reception. If l=m in the first and second embodiments, it is then easily imagined that such an encoding/decoding method would be obtained as an actual encoding/decoding method. Incidentally, the first and second applications according to the present invention can be easily applied even to the third application according to the present invention or the case in which the general m wireless transmitting stations exist.

Figure 5:
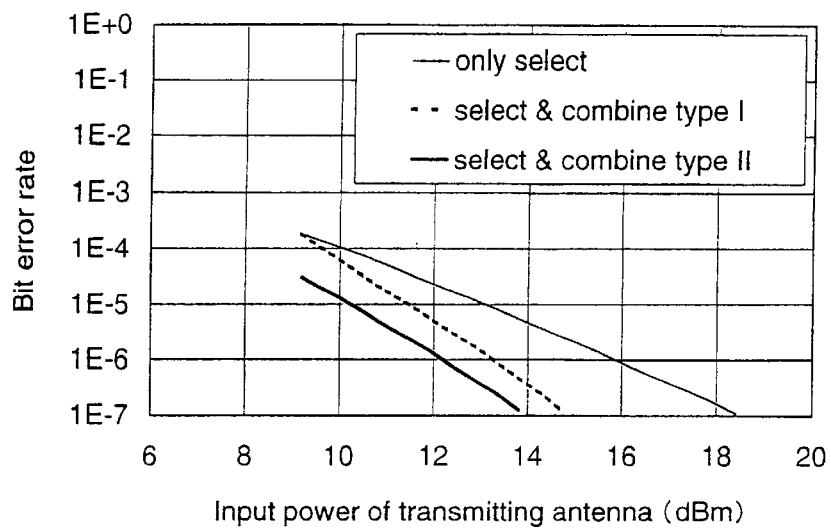
FIG. 5 is a diagram showing one example of an effect of the present invention.

FIG. 5 shows one example of an effect of the present invention, which corresponds to the results obtained by supposing the following conditions (1) through (3) and calculating bit error rates of received data of the wireless receiving station 21 to transmitting power of the wireless transmitting stations 01 and 02.

Figure 6:
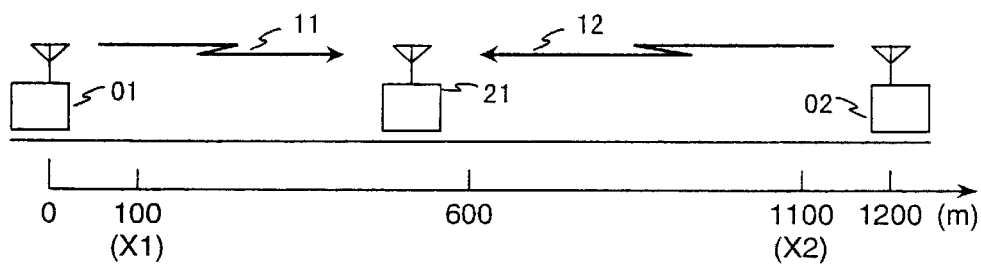
FIG. 6 is a diagram for describing one condition for calculations upon showing one example of the effect of the present invention.

(1) Condition for the positions of wireless stations: The wireless transmitting stations 01 and 02 are installed with an interval of 1200 m interposed therebetween and respectively transmit data to the wireless receiving station 21 through their corresponding radio communication channels 11 and 12. Now consider where the wireless receiving station 21 receives data from the wireless transmitting stations 01 and 02 while it is moving along a line segment with the wireless transmitting station 01 and the wireless transmitting station 02 as both ends between a point X1 spaced 100 m away from the wireless transmitting station 01 and a point X2 spaced 1100 m away therefrom (see FIG. 6). Here, the existing positions of the wireless receiving station 21 over the line segments X1 and X2 will be placed under uniform distribution.

(2) Condition for propagation environments: The condition is placed under a stationary flat fading environment. Receiving power will be attenuated in proportion to the square of the distance from each transmitting station to the point spaced 100 m away therefrom and attenuated in proportion to the fourth power of the distance at above it.

(3) Condition for radio communication system: A radio frequency is set to a 2.4 GHz band and a bandwidth is set to 26 MHz. In the transmitters 012 and 022 in the wireless transmitting stations 01 and 02, a modulation system will be defined as QPSK and a symbol rate will be defined as 26000000÷31 symbols/second. In the receiver 212 of the wireless receiving station 21, a demodulation system will be defined as differential detection, and diversity for pure-selection combining two diversity channels will be applied after the detection. Further, the noise factor of the receiver and the temperature thereof are regarded as 7 dB and 300K respectively. Incidentally, the gains of the transmitting antennas 011 and 021 and receiving antenna 211 will be defined as 2.14 dBi respectively.

Referring to FIG. 5, "the conventional system" is a system for selecting either one of data of 600 bits respectively received from the radio communication channels 11 and 12, based on an error check made by CRC or the like. Incidentally, the probability of undetected error at the error check is supposed to be 0 for simplification.

A "system 1 according to the present invention" is one example in which the first embodiment according to the present invention is applied. Described specifically, the genus g=0 and $F=GF(2^8)$. Further, the encoders 013 and 023 are configured so that the linear codes $C_1$ and $C_2$ become (75, 75) codes and the linear code $C_{12}$ becomes (150, 75) codes. The decoding unit 216 performs an error check on the received data sent from the wireless transmitting stations 01 and 02 as in the case of the second application according to the present invention. When an error is detected from both, the two data are combined into one and the decoder 2160 performs a bounded distance decoding process on the minimum distance 76. Incidentally, the probability of undetected error at the error check is supposed to be 0 for simplicity.

A "system 2 according to the present invention" is one example in which the second embodiment according to the present invention is applied. Described specifically, the encoders 013 and 023 are respectively configured so as to provide convolutional codes $C_1$ and $C_2$ each having a code length of 600 bits over GF(2) with the transfer function matrixes $G^1(D)=[1+D^2+D^3+D^4+D^8]$ and $G^2(D)=[1+D+D^2+D^3+D^5+D^7+D^8]$. Further, the transfer function matrix $G^{12}(D)$ is equivalent to $G^{12}(D)=[G^1(D)\ G^2(D)]=[1+D^2+D^3+D^4+D^8\ 1+D+D^2+D^3+D^5+D^7+D^8]$. A convolutional code $C_{12}$ provides the code rate of ½ and a minimum free distance of 12. The decoding unit 216 performs an error check on the received data sent from the wireless transmitting stations 01 and 02 as in the case of the second application according to the present invention. When errors are detected from the both stations 01 and 02, the both data are combined into one and the decoder 2160 performs a process for the Viterbi decoding algorithms. Incidentally, the probability of undetected error at the error check is supposed to be 0 for simplicity. In the "system 2 according to the present invention" 8 bits corresponding to the final input at encoding is regarded as 0 as one technique of terminating the Viterbi decoding algorithms.

According to FIG. 5, it is understood that when the bit error rate is $10^{-6}$, for example, the "system 1 according to the present invention" and "system 2 according to the present invention" can respectively reduce transmitting power by 3 to 4 dB as compared with the "conventional system".

Figure 7:
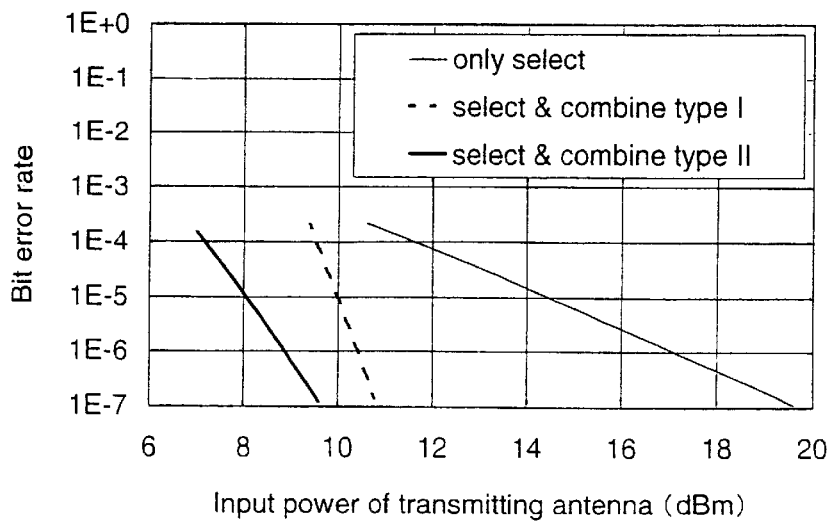
FIG. 7 is a diagram for describing one characteristic in one example of the effect of the present invention.

On the other hand, FIG. 7 shows a result obtained when the position of the wireless receiving station 21 is limited to a middle point between the wireless transmitting stations 01 and 02, i.e., a point at a distance of 600 m under the conditions (1) through (3) referred to above. According to the same drawing, it is understood that the "system 1 according to the present invention" and "system 2 according to the present invention" respectively bring about an advantageous effect in that when the bit error rate is $10^{-6}$, for example, transmitting power can be reduced by 6.5 to 8 dB as compared with the "conventional system".

Thus, in the diversity wireless transmitting/receiving system for transmitting data having the same contents from a plurality of wireless transmitting stations and performing diversity reception of the data having the same contents, when the respective transmitting stations respectively perform encoding on the data having the same contents in advance according to respective radio channels through which the respective transmitting stations transmit the data, the respective encoding are carried out so that one of fragments of code words in error correcting codes is generated and fragments of code words corresponding to the plurality of radio channels form one code word in an error correcting code. Further, the respective maps are set to injection. On the other hand, the wireless receiving station stores the received data therein according to the received radio channel and applies decoding processes different according to the number of the received data. When data can be received only from the nearest wireless transmitting station due to reasons such as the existence of the wireless receiving station in the neighborhood of one wireless transmitting station, such received data normally has a high degree of reliability. Therefore, desired data can be obtained by decoding the data sent from the nearest wireless transmitting station. Even when data can be received from a plurality of wireless transmitting stations due to reasons such as the existence of a wireless receiving station in a point located midway between the plurality of wireless transmitting stations, these received data having suitable reliability can be decoded as strong error correcting codes if they are utilized in combination according to a predetermined procedure. Therefore, if compared with such a conventional system as to select one from the received data obtained in plural form, then the possibility that desired data will be obtained, is brought to a leap in improvement. As a result, transmitting power of each wireless transmitting station for satisfying required communication quality can be reduced.

It is further understood by those skilled in the art that the foregoing description is a preferred embodiment of the disclosed device and that various changes and modifications may be made in the invention without departing from the spirit and scope thereof.

What is claimed is:

1. A wireless communication station used with a diversity wireless communication system having a plurality of wireless transmitting stations transmitting data having the same contents through radio channels different from each other, comprising:

a first selector;

a plurality of first decoders;

a combiner; and a second decoder connected to the combiner;

wherein, when a single data is received through a radio channel alone, the first selector selects one of the first decoders, and the one of the first decoders decodes the received single data by a decoding method corresponding to encoding specified by a radio channel through which the single received data passed;

when a plurality of data having the same contents are received through plural radio channels, the first selector selects the combiner, the combiner combines the received plurality of data in predetermined order according to the radio channels, and the second decoder decodes the received plurality of data as a sequence in which an error pattern is added to a code word in an error correcting code.

2. A wireless communication station according to claim 1, further comprising a receiver for measuring a signal strength value to the received data, wherein the first selector compares the received signal strength value with a predetermined threshold for each received data, and selects one received data corresponding to the received signal strength value exceeding the predetermined threshold, and the one received data is sent to a predetermined decoder.

3. A wireless communication station according to claim 1, further comprising a plurality of detectors for respectively performing syndrome calculation corresponding to the radio channel through which the received data passed, wherein the first selector selects one received data which brings a result of the syndrome calculation to zero and the one received data is sent to a predetermined decoder.

4. A wireless communication station according to claim 1, further comprising:

a second selector decoded data in interlock with the first.

* * * * *